United States Patent [19]
Leuschner

[11] 3,970,941
[45] July 20, 1976

[54] FAST PROGRAMMABLE DIVIDER WITH A NEW 5-GATE FLIP-FLOP

[75] Inventor: Horst Leuschner, Dallas, Tex.

[73] Assignee: Texas Instruments Incorporated, Dallas, Tex.

[22] Filed: Feb. 18, 1975

[21] Appl. No.: 550,320

[52] U.S. Cl. ................................. 328/41; 328/46; 328/48
[51] Int. Cl.² ................. H03K 21/00; H03K 23/02
[58] Field of Search ........ 307/220 R, 224 R, 225 R, 307/226 R, 215; 328/39, 41, 42, 46, 48

[56] References Cited
UNITED STATES PATENTS
3,811,092   5/1974   Charbonnier ......................... 328/39

OTHER PUBLICATIONS
B407,357 1/1975, Segal 328/41.

Primary Examiner—John Zazworsky
Assistant Examiner—Marcus S. Rasco
Attorney, Agent, or Firm—Harold Levine; James T. Comfort; James O. Dixon

[57] ABSTRACT

An N-bit programmable divider comprising N "T" flip-flops, N load gates, N-2 enable gates, an output JK flip-flop and a least-significant-bit input inverter; the least-significant-bit flip-flop being enabled by Q of said output flip-flop, the second-least-significant-bit flip-flop being enabled by Q of said least-significant-bit flip-flip, each of said remaining T flip-flops being enabled by NORed Q outputs of all less-significant-bit flip-flops, said output flip-flop having a J input only when the outputs of said N T flip-flops are indicative of a count of 2 and having a K input only with a Q output of said output flip-flop; the divider being loaded by application during Q of the output flip-flop of the complement of the least-significant-bit signal to the clear of the least-significant-bit T flip-flop and higher-significant-bit signals to preset of respective higher-significant-bit T flip-flops.

5 Claims, 5 Drawing Figures

FAST PROGRAMMABLE DIVIDER WITH A NEW 5-GATE FLIP-FLOP

The present invention relates to electronic logic circuits and more particularly to so-called "flip-flop" circuits which change their state, from "on" to "off" or from "off" to "on," in response to an input trigger pulse and applied control pulses.

Flip-flop circuits of various types are well-known in the prior art and belong generally to the class of circuits often called multivibrators which are used in large numbers in logic or control systems such as special or general-purpose digital computers, electronic calculators, digital electronic switching systems or digital electronic control systems.

The basic building blocks of any digital electonic system are a class of circuits known as "gate" circuits. These circuits are designed to provide an output in response to a specific set of signal conditions existing at their one or more inputs. Various gate circuits are designated according to the logic function performed such as, for example, AND, OR, NAND, or NOR gates.

Although logic circuits and systems can be constructed from individual components such as signal translators (transistors or vacuum tubes), resistors, capacitors, etc. in modern practice they are embodied in integrated circuits wherein all elements of the circuit are formed in or on a small "chip" of semiconductor material. Often, many such circuits are formed on a single piece of semiconductor material to form a complete complex electronic system embodying hundreds or thousands of circuits. Such devices are commonly referred to as LSI (Large Scale Integration) devices.

In LSI devices, as in most electronic systems, reducing the number of elements required to perform a given function leads generally to reduced manufacturing cost, reduced operating cost and power consumption and, often, enhanced reliability.

By the present invention, a bistable multivibrator or flip-flop function is provided using only four gates together with a clock signal shaping circuit rather than the six or more gates commonly used to provide such a function in the prior art. The flip-flop of the present invention comprises a pair of NAND or NOR gates interconnected to form an output latch. Input to the latch is provided by two additional gates of the same type interconnected to provide set/reset gating steered by the output of the latch and a clock pulse generator. The clock pulse generator function can be supplied under most conditions by only one additional gate.

The novel flip-flop circuit of the present invention can be used to provide novel logic circuits such as counter/divider circuits, programmable dividers and others with saving in semiconductor chip size required in LSI devices approaching 33%.

In such a counter/divider circuit each stage consists of only four gates forming a flip-flop circuit of the type above-disclosed. All of the stages are triggered simultaneously from a common clock pulse generator while the preset or clear function signals are provided in parallel to all stages. By adding one loading gate per stage, one enable gate per stage for each bit over two and a JK flip-flop output stage to the counter/divider circuit a very fast low cost programmable divider circuit is provided.

Use of the novel flip-flop circuit of the present invention in integrated circuits and LSI devices results in significant savings in the manufacturing costs and enhances the reliability of such devices.

Further details and advantages of the present invention will become obvious from the following detailed description when read in connection with the accompanying drawings in which.

Figure 1:
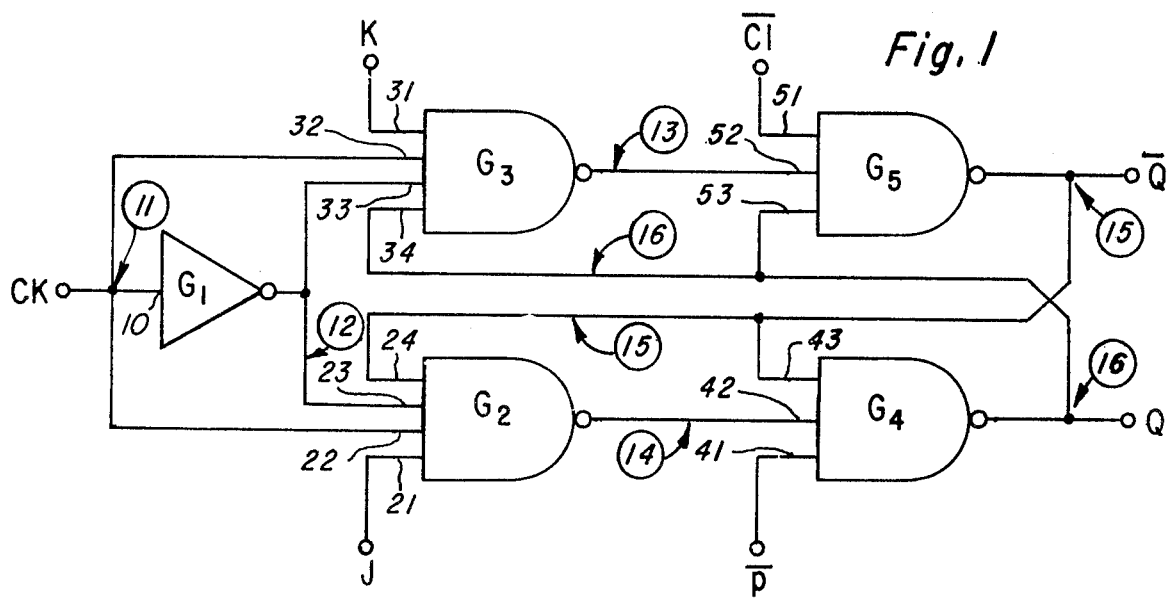
FIG. 1 is a schematic diagram depicting the novel flip-flop circuit of the present invention.

The flip-flop circuit of the present invention is shown in FIG. 1. It comprises a simple inverter $G_1$, two four-input NAND or inverting AND gates $G_2$ and $G_3$ and two three-input NAND or inverting AND gates $G_4$ and $G_5$. The input and output terminals of the circuit are designated by standard nomenclature as input terminals CK (clock), J, K, $\overline{CL}$ (clear) and $\overline{P}$ (preset) and output terminals Q and $\overline{Q}$. Clock input terminal CK is connected directly to the input 10 of gate $G_1$ and inputs 22 and 32 of gates $G_2$ and $G_3$ respectively. The output of inverter gate $G_1$ is connected directly to inputs 23 and 33 of gates $G_2$ and $G_3$ respectively. The J input terminal is connected directly to input 21 of gate $G_2$ and the K input is connected directly to input 31 of gate $G_3$.

The outputs of inverting gates $G_2$ and $G_3$ are connected directly to inputs 42 and 52 respectively of gates $G_4$ and $G_5$. The preset input terminal, $\overline{P}$, is connected directly to input terminal 41 of gate $G_4$ and the clear input terminal $\overline{CL}$ is connected directly to input 51 of gate 5. The output of inverting gate $G_5$ is connected directly to the output terminal $\overline{Q}$ as well as to input terminals 43 of gate $G_4$ and 24 of gate $G_2$ while the output of inverting gate $G_4$ is connected directly to output terminal Q as well as to the input 53 of gate $G_5$ and input 34 of gate $G_3$. The circuit of FIG. 1 constitutes an edge-triggered JK flip-flop.

Gates $G_1$ through $G_5$ may be of any known types especially those known to be well-adapted for use in semiconductor integrated circuits such as, for example, those types known as TTL (transistor transistor logic) or I²L (integrated injection logic). It is preferable that all of these gates be the same type construction so as to facilitate the embodiment of all of the gates in a single integrated circuit element.

The operation of the circuit of FIG. 1 is best explained with reference to the pulse diagram of FIG. 2. By standard positive logic nomenclature the output of each of the inverting AND gates $G_2$ through $G_5$ will be logic 1 or high when any one or more of its inputs is logic 0 or low. Only when all of the inputs to one of these gates are high or logic 1 will the output of that gate change to logic 0 or low. The output of gate $G_1$ is 1 when the input is 1 and 9 when the input is 1. The propagation delay time, hereinafter referred to as $T_{pd}$ is the time required for a change in the gate input conditions to be manifested in a change in output conditions of that gate and for purposes of this invention is assumed to be the same for all gates of the circuit.

It will be assumed for purposes of explanation that a logic 1 is applied to terminals J, K, $\overline{CL}$ and $\overline{P}$ of the circuit of FIG. 1 and output $\overline{Q}$ is producing a logic 1 and Q is producing logic 0. A clock signal of the type indicated by pulse diagram 11 in FIG. 2 is applied to input CK and thus appears at gate inputs 10, 22 and 32 as indicated by (11) in FIG. 1. The resulting output signal of gate $G_1$ indicated by pulse diagram 12 in FIG. 2 is applied to inputs 23 and 33 of gates $G_2$ and $G_3$ respectively as indicated by (12) in FIG. 1. Output signals 13 and 14 of FIG. 2 are produced by gates $G_3$ and $G_2$ respectively and applied to inputs 52 and 42 of gates $G_5$ and $G_4$ respectively as indicated by (13) and (14) in FIG. 1. Gate $G_5$ produces output signal 15 of FIG. 2 which is applied to output terminal $\overline{Q}$ and gate inputs 24 and 43 as indicated by (15). Gate $G_4$ produces output signal 15 of FIG. 2 which is applied to output terminal Q and gate inputs 34 and 53 as indicated by (16).

Figure 2:
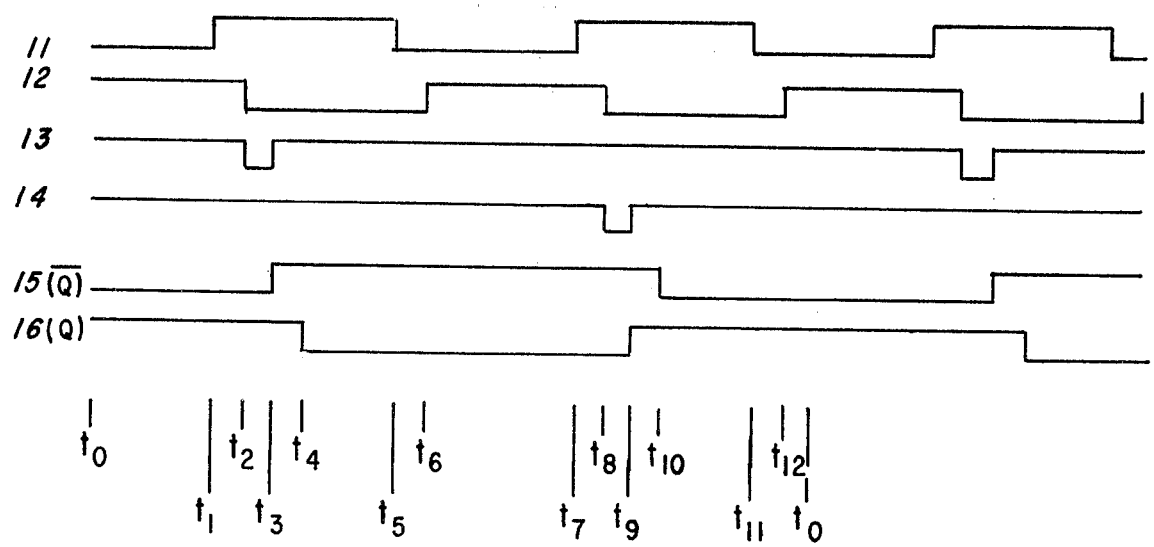
FIG. 2 is a pulse diagram helpful in understanding the operation of the circuit of FIG. 1.

As a starting point, explanation of the operation of the circuit of FIG. 1 will begin at a time designated $T_0$ in FIG. 2. At time $T_0$ signals 11 and 15 ($\overline{Q}$) are 0 and signals 12, 13, 14 and 16 (Q) are 1. At $T_1$ clock signal 11 goes to 1. After the gate propagation delay time or $1T_{pd}$ the output of gate $G_1$ goes to 0 as shown at time $T_2$ in response to the 1 input to that gate. Thus, during the time period between $T_1$ and $T_2$ all inputs, 31, 32 (11), 33 (12) and 34 (Q) are at logic 1 level with the result that after $1T_{pd}$ period or at time $T_2$ the output signal of gate $G_3$ (13) will change from 1 to 0. Gate $G_2$ is unaffected by the changes to its inputs 22 and 23 at the time $T_1$ and $T_2$ since the $\overline{Q}$ signal to input 24 remains at 0 during this time holding gate $G_2$ output signal 14 at 1.

After one more propagation delay period, i.e., at $T_3$, $G_3$ output signal 13 returns to 1 in response to signal 12 at input 33 dropping to 0 at $T_2$ as explained above. Also at $T_3$ output signal 15 ($\overline{Q}$) of gate $G_5$ goes to 1 in response to input 52 (signal 13) dropping to 0 during the time $T_2$ to $T_3$. At the time $T_3$ all three inputs 41, 42 and 43 become 1 and so after one $T_{pd}$ or at $T_4$ output Q (signal 16) drops to 0.

The transition of the clock signal 11 from 1 to 0 at $T_5$ and the resulting transition of signal 12 from 0 to 1 at $T_6$ have no effect on the outputs of gates $G_2$ through $G_5$ since at least one input to each of gates $G_2$, $G_3$ and $G_5$ will be at 0 from $T_5$ through $T_7$ and all inputs of $G_4$ remain at 1.

The next 0 to 1 transition of clock signal 11 at $T_7$ produces another toggle of the circuit outputs Q and $\overline{Q}$. From FIG. 2 it can be seen that the output 12 of gate $G_1$ changes at $T_8$, output 13 of gate $G_3$ is unaffected, output 14 of gate $G_2$ drops to 0 at $T_8$ and returns to 1 at $T_9$, output 16 (Q) changes to 1 at $T_9$ and, finally, output 15 ($\overline{Q}$) changes to 0 at $T_{10}$ thus completing one output cycle. The next transitions of signals 11 and 12 at $T_{11}$ and $T_{12}$ return the entire circuit to its assumed starting condition of $T_0$.

From the diagrams of FIG. 2 it can be seen that the positive-going transition of the outputs Q and $\overline{Q}$ occur at $T_3$ or just two propagation delay periods after the positive-going transition of the input clock signal at $T_1$ while the negative-going transitions in the outputs of Q and $\overline{Q}$ occur at $T_4$ or just three $T_{pd}$ after the positive-going transition of the input clock signal. Proper operation requires only that the next positive transition of the clock pulse does not occur before the negative-going transition of the output pulse at Q or $\overline{Q}$ which is in response to the previous positive clock pulse transition. Thus, clock frequencies as high as $1/3T_{pd}$ may be used as input to the circuit of FIG. 1.

Further, those skilled in the art will recognize that NAND gates $G_2$, $G_3$, $G_4$ and $G_5$ may be replaced by NOR gates if the J and K inputs are replaced by $\overline{J}$ and $\overline{K}$ inputs respectively and the CL and P inputs are replaced by $\overline{CL}$ and $\overline{P}$ inputs respectively. In such a circuit toggle action would be initiated by the negative-going edge of the clock signal.

The flip-flop circuit of the present invention finds its most advantageous uses in LSI devices and systems such as, for example, counters and dividers.

Figure 3:
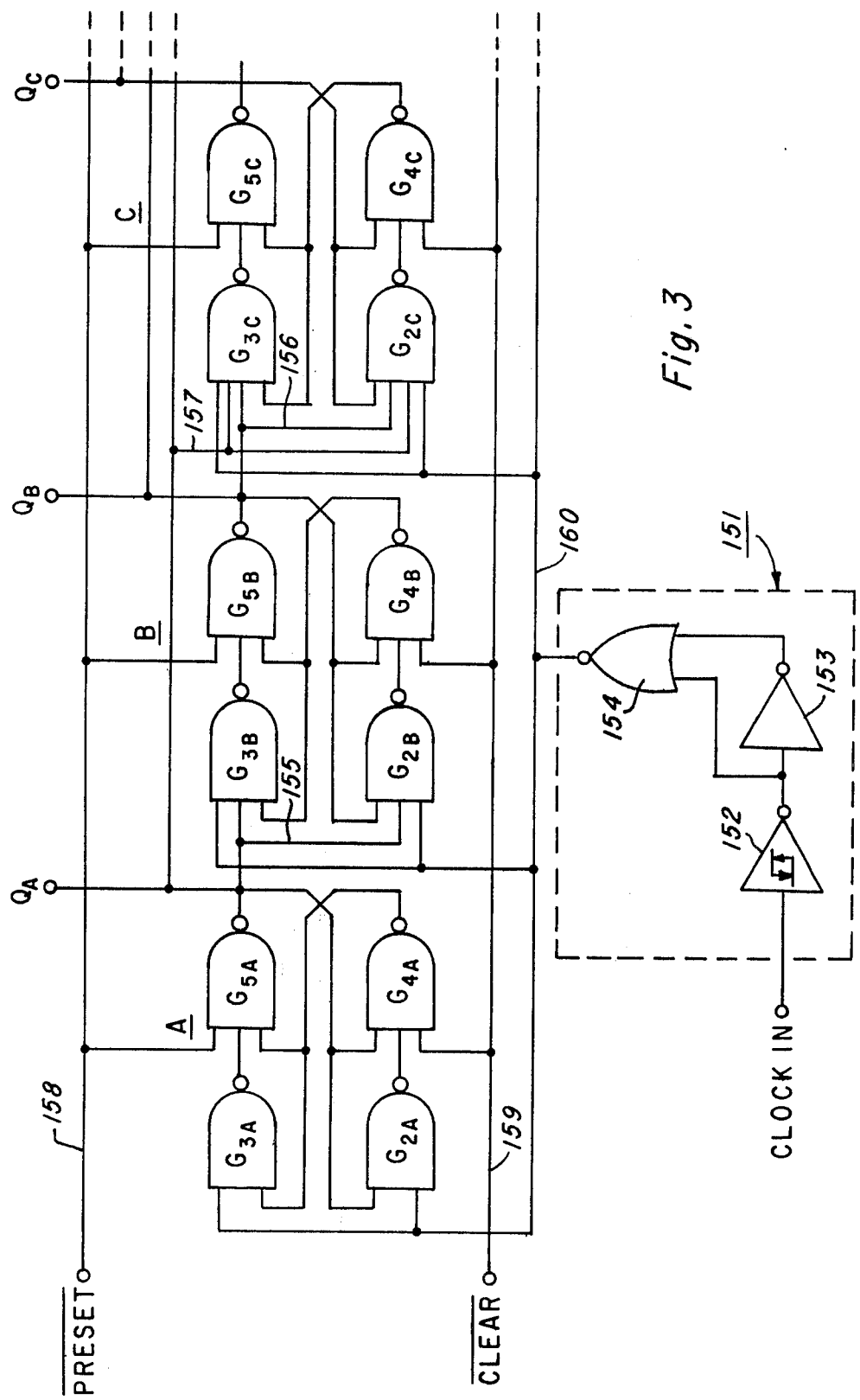
FIG. 3 is a schematic diagram of a novel counter/divider circuit using the flip-flop circuit of FIG. 1.

Using the principles disclosed in connection with the construction of the flip-flop circuit of FIG. 1, a synchronous counter/divider provided with preset and clear inputs can be constructed using only four NAND or NOR gates per stage. Such a counter/divider is shown in FIG. 3. In the counter of FIG. 3 all counter stages are clocked simultaneously from the clock pulse generator 151. Use of this clock pulse generator in this manner allows elimination in each stage of the counter of one inverter gate ($G_1$ in FIG. 1) and two inputs (22 and 32) to each flip-flop. Although the clock pulse generator uses a Schmitt trigger circuit 152, and inverter 153 and a NOR gate 154 to generate the clock impulse inputs, its use provides a substantial savings in the area required on a semiconductor integrated circuit chip to provide a counter of a given length. For example, most present day counters use six gates per stage so the saving in area required per counter would be equal to the area of the two gates times the number of stages of the counter less the area for the clock pulse generator. In longer counters requiring a large number of stages, the area savings offered by the counter of FIG. 5 approaches 33% from present counters.

The clock pulse to be provided by the clock pulse generator, which must be negative-going for the NAND gate embodiment shown in FIG. 3 or positive-going for the NOR gate embodiment, must be of sufficient length to trigger one gate but less than two gate propagation delay times. A clock generator output pulse of from 1.2 to 1.8 $T_{pd}$ has been found satisfactory.

Of course, the propagation delay times of different gates, even of the same construction on the same semiconductor chip, may be slightly different. Thus the minimum clock pulse width must be equal to or longer than the $T_{pd}$ of the slowest gate in any driven flip-flop. The maximum clock pulse width must be equal to or shorter than the sum of the $T_{pd}$'s of the two fastest gates in any driven flip-flop.

Thus, the inverter 153 may comprise a "standard" one input NAND gate with its propagation delay time lengthened about 40% by a change in resistor values from "standard," by slight increase in transistor size or by the addition of a very small capacitance. The Schmitt trigger circuit is necessary only to insure constant rise times when the clock pulses are to be supplied from an unknown source and thus will have an unknown shape. If it is known that the clock pulses will be of a specified quality and of a sharp rise time, the Schmitt trigger 152 may be omitted.

Each stage of the circuit of FIG. 3 then operates in a manner similar to the circuit of FIG. 1. Use of the clock pulse generator, however, saves one gate and two gate inputs per stage and allows a clock frequency with a period as low as about 3 $T_{pd}$.

Each stage of the counter of FIG. 3 is a four gate flip-flop circut of the type shown in FIG. 1 with slight modifications. In Stage A, for example, the J and K inputs for gates $G_{2A}$ and $G_{3A}$ respectively are unnecessary and are therefore omitted. In Stage B the J and K inputs are connected together and constitute an "enable" input receiving the $Q_A$ output over line 155. Stage C has additional J and K inputs connected together as an additional "enable" input receiving the output of $Q_B$ on line 156. Both $Q_B$ output and $Q_A$ output, line 157, are required to enable Stage C. Additional "enable" inputs are required for each higher order stage of the counter. $\overline{Preset}$ and $\overline{clear}$ signals are supplied to all stages of the counter over lines 158 and 159 respectively. Clock pulses from the clock pulse generator 151 are fed to all stages of the counter simultaneously over line 160. Counter output is taken from the terminals $q_A$, $Q_B$, $Q_C$ . . . $Q_N$.

Inspection of the circuit of FIG. 3 will show that Stage A is always enabled and will "toggle" or count at each clock pulse. Stage B is enabled only when the output of Stage A, $Q_A$, is 1 and will therefore "toggle" or count every second clock pulse. Likewise, Stage C is enabled only when both $Q_A$ and $Q_B$ are 1 and will count only every fourth clock pulse. Thus, the binary count of outputs $Q_A$, $Q_B$, $Q_C$ . . . $Q_N$ advances 1 with each input clock pulse in the well-known manner.

By adding a few input and enable gates together with an output flip-flop to the synchronous count of FIG. 3 a programmable divider is provided.

Figure 4:
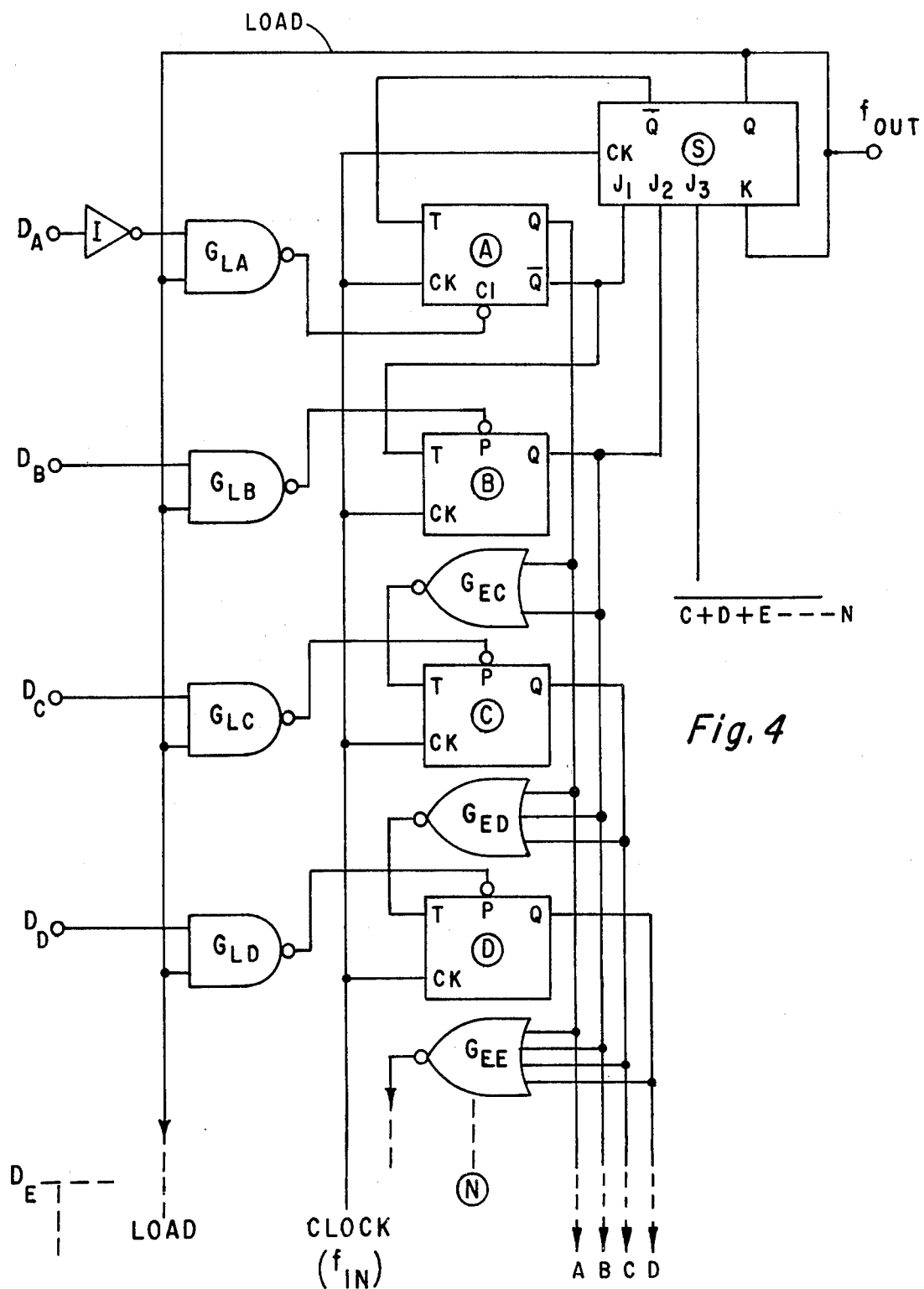
FIG. 4 is a schematic diagram of a novel programmable divider circuit using the flip-flop circuit of FIG. 1.

The programmable divider of FIG. 4 is a synchronous down counter comprised of the T flip-flops Ⓐ Ⓑ Ⓒ . . . Ⓝ. Each of these flip-flops are of the type shown in FIG. 1 with the J and K inputs both connected to the T or "enable" input terminal. The counter is preset to the desired divisor by the gate $G_L$ and the input D to each stage. as is standard in circuits of this type, input $E_A$ and flip-flop Ⓐ are associated with the least significant bit of the divisor, input $D_B$ and flip-flop Ⓑ are associated with the second least significant bit of the divisor, etc. (An inverter I is inserted between input $D_A$ and gate $C_{LA}$ for reasons to be explained later.) For example, if it is desired to divide the input clock frequency by five, a logic 1 is applied to the $D_A$ and the $D_C$ inputs and logic 0 to all of the other D inputs. Thus, when the Q output of the output flip-flop Ⓢ is logic 1, gate $G_L$ of each stage applies the $\overline{D}$ input either 1 or 0 to the $\overline{P}$ input of that stage with the exception of Stage A in which the D input is applied to the $\overline{CL}$ input. The counter then begins to count down from the loaded number (divisor) which in this example is a decimal five or a binary 0 . . . 010.

When the counter has counted down to decimal 2, binary 0 . . . 0010, the Q outputs of all of the counter stages except B go to 0 so that all of the J inputs, $J_1$, $J_2$ and $J_3$ of the flip-flop Ⓢ become 1 at a time which is two $T_{pd}$ after the positive transition of the clock pulse which brings the counter to the count decimal 0002.

The next clock pulse brings the counter to 0001 (decimal and binary) and simultaneously sets the flip-flop Ⓢ Q of flip-flop Ⓢ therefore goes high two $T_{pd}$ after the positive edge of this clock pulse and $\overline{Q}_S$ goes low three $T_{pd}$ after the positive edge of this clock pulse thus disabling flip-flop Ⓐ. When $Q_S$ goes high a 1 is applied through the load line to one of the inputs of each of the gates $G_{LA}$ . . . $_N$. Thus, one $T_{pd}$ after the load line goes to 1 the appropriate inputs from the D terminals have been applied to all stages of the counter. By two $T_{pd}$ later all of the flip-flops of the counter have latched to the output state depicting the D inputs of division number and the counter is again loaded. Thus, by five $T_{pd}$ after the positive-going edge of the last or fifth clock pulse and before the positive-going edge of the next or first clock pulse the counter is again set to the pre-scribed divider ratio value. After one additional $T_{pd}$ (for gates $G_E$) the T inputs of all the flip-flops are settled. The counter is enabled again two $T_{pd}$ after the positive edge of the first clock pulse, i.e., when $\overline{Q}_S$ goes to 1, and the countdown cycle starts again.

Figure 5:
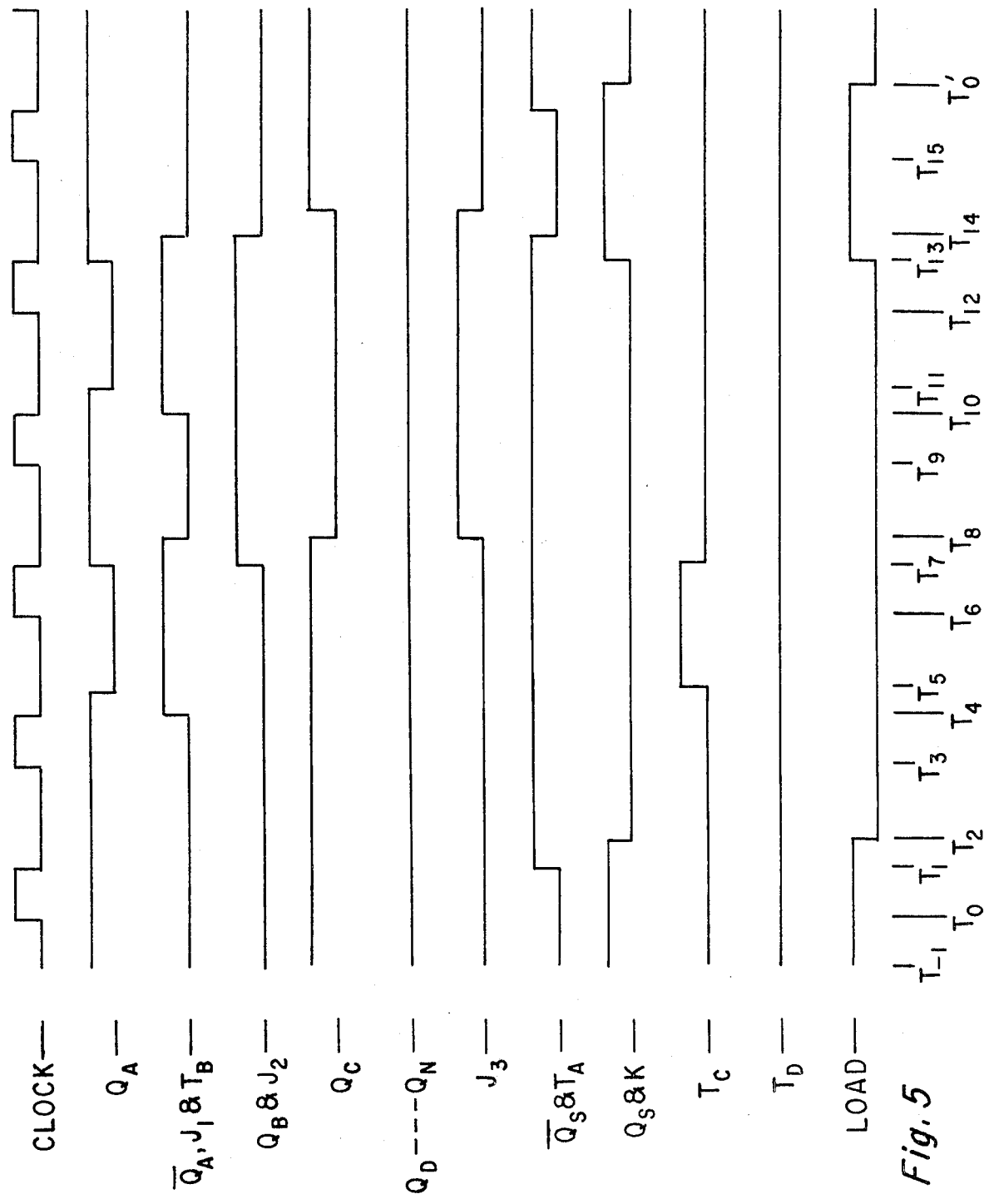
FIG. 5 is a pulse diagram helpful in understanding the operation of the circuit of FIG. 4.

The above sequence of events is depicted by the pulse diagram of FIG. 5 representing the logic states of various terminals of the counter set to divide the clock pulse rate by 5. At time $T_{-1}$, just before the first clock pulse, the counter has been loaded to 5 ($Q_A = 1$, $Q_B = 0$, $Q_C = 1$ remaining stage Q's equal 0). The clock pulse period for these diagrams is two $T_{pd}$, the maximum. The clock frequency is $1/6$ $T_{pd}$. At $T_0$ clock pulse 1 begins. The counter flip-flops are disabled, i.e., all T's equal 0, and therefore their outputs do not change. Since K is equal 1 flip-flop Ⓢ toggles with $\overline{Q}_S$ and $T_A$ becoming 1 at $T_1$ and $Q_S$, K and the load line going to 0 one $T_{pd}$ thereafter at $T_2$. (Note the $\overline{clear}$ and $\overline{preset}$ inputs would be held for one additional $T_{pd}$). At the positive edge of the second clock pulse, $T_3$, only counter stage A is enabled ($T_A$ - 1 thus at $T_4$, $\overline{Q}_A$, $J_1$ and $T_B$ become 1 at $T_5$ $Q_A$ becomes 0 and $T_C$ becomes 1 resulting in a counter state of binary 0100 or decimal 4. At $T_6$ the third clock pulse begins. Flip-flops Ⓐ Ⓑ and Ⓒ all being enabled ($T_A$, $T_B$ and $T_C = 1$) will toggle with $Q_A$ and $Q_B$ becoming 1 at $T_8$ and $\overline{Q}_A$, $J_1$, $T_B$, $Q_C$ and $T_C$ all becoming 0 at $T_9$. At the same time $J_3$ becomes 1. The counter now registers binary 0011 or decimal 3.

The positive edge of the fourth clock pulse occurs at $T_{10}$ when flip-flop Ⓐ (only) is enabled ($\overline{Q}_S$ and $T_A$ at 1; $T_B$, $T_C$, $T_D$ at 0). In response to this clock pulse flip-flop Ⓐ toggles and $\overline{Q}_A$, $J_1$ and $T_B$ go to 1 at $T_{11}$ and $Q_A$ to 0 at $T_{12}$ changing the counter output to 0010 or decimal 2. At the positive edge of the fifth clock pulse at $T_{13}$, $J_1$, $J_2$ and $J_3$ are all at 1 as well as $T_A$ and $T_B$. Thus flip-flops Ⓐ Ⓑ and Ⓢ all toggle with $Q_A$, $Q_S$, K and the load line all becoming 1 at $T_{14}$. One $T_{pd}$ later at $T_{15}$, $\overline{Q}_A$, $J_1$, $T_B$, $Q_B$, $J_2$, $\overline{Q}_S$ and $T_A$ all drop to 0. Immediately after $T_{15}$ the counter output is 0001, the output pulse at Q $_S$, indicating that five clock pulses have occurred, has begun. Thus, the counting cycle is complete.

Between the time $T_{14}$ and the positive edge of the next clock pulse (the next $T_0$) the counter is again loaded with the divisor number 5 to begin the next counting cycle as follows.

At $T_{14}$ which is at or after the negative edge of the fifth clock pulse, the load line becomes 1 and one $T_{pd}$ later $\overline{Q}_S$ goes to 0 disabling Ⓐ. One $T_{pd}$ after the load line becomes 1 the D inputs are applied through gate $G_L$ to the $\overline{preset}$ or $\overline{clear}$ inputs of the counter stages and after one additional $T_{pd}$ the stage outputs which must change from 0 to 1 have been set. Thus, the counter has been reset to its "initial" condition by $T_0'$. It should be recognized that if the divider ratio is an even number $D_A$ will be 0 and therefore it will require a total time of six $T_{pd}$ from the beginning of the "last" clock pulse for the T inputs of all the flip-flops to assume their correct condition for the next or "first" clock pulse at $T_0'$ to trigger correctly.

The load circuit of the programmable counter is much less complex and faster than comparable circuits for many present counters in that only one gate per stage is required. Since all stages of the counter except Ⓐ will always be at 0 after the "last" clock pulse it is required only that the 1's at the D terminals be loaded and possibly a 0 to stage Ⓐ depending on the divisor to be loaded. Thus, the outputs of Ⓑ and all subsequent stages will be latched to the loaded divisor and ready to begin counting within 2 $T_{pd}$ after the load pulse ($\overline{Q}_S$) begins. Stage Ⓐ will be loaded and latched within 3 $T_{pd}$ after the load pulse begins but this longer time is not restrictive on the speed of the divider since stage Ⓐ is disabled for the duration of the load pulse which overlaps the "first" clock pulse.

It should be noted that the timing shown in the pulse diagrams of FIG. 5 is applicable for T²L circuit construction in which NOR gates such as $G_L$ have the same propagation delay time as the other gates. The timing would be slightly different were the counter of I²L construction in which the propagation delay time of NOR gates would be 0.

Thus, there have been disclosed novel logic circuits incorporating a novel four-gate flip-flop circuit which offers substantial savings in the space required to implement the circuit on integrated circuit semiconductor chips and, therefore, provides a substantial saving in manufacturing cost of such devices.

What is claimed is:

1. A programmable divider for dividing an input pulse train signal by any whole number divisor represented by an N-bit binary number where N is an integer comprising: an output terminal, a pulse train input terminal, and a divisor-bit input terminal for each bit of said N-bit binary number, an output JK flip-flop, a T flip-flop stage for each bit of said N-bit binary number, means responsive to a load signal to apply the complement signal of the bit of said N-bit binary number appearing at the least significant bit input terminal of said divisor bit input terminals to the clear input of the T flip-flop stage for the least significant bit of said binary number, means responsive to said load signal to apply the bit signal appearing at each of the remaining divisor bit input terminals to the preset terminal of a respective one of each of the others of said T flip-flop stages, means to apply a signal appearing at said pulse train input terminal to the clock terminal of each of said flip-flops, means applying the Q output of said output flip-flop to said output terminal, to the K input of said output flip-flop and as the load signal to each of said means responsive to a load signal, means applying the $\overline{Q}$ output of said output flip-flop to the T input of said least significant bit flip-flop, means applying the $\overline{Q}$ output of said least significant bit flip-flop to a J input of said output flip-flop and to the T input of the flip-flop receiving signal from the divisor bit input terminal receiving the second least significant bit of said N-bit binary number, means associated with each T flip-flop stage other than said least significant bit flip-flop stage and said second least significant bit flip-flop stage to receive the Q outputs from all T flip-flop stages associated with less significant bits of said N-bit binary number than said associated T flip-flop stage and to apply to the T input of said associated flip-flop stage the NOR function of said received Q outputs, means applying the Q output of said second least significant bit T flip-flop stage to a second J input of said output flip-flop and means receiving the Q outputs of all of said T flip-flop stages other than said least significant bit and said second least significant bit T flip-flops and applying the NOR function signal thereof to the remaining J inputs of said output flip-flop.

2. An N-bit programmable divider as defined in claim 1 wherein each of said flip-flops consists of four multiple-input inverting gates.

3. An N-bit programmable divider as defined in claim 2 having in addition means providing a clock pulse of a length of from 1 to 2 times the propagation delay time of the slowest gate of said flip-flops.

4. An N-bit programmable divider as defined in claim 2 wherein each of said multiple-input inverting gates is a NAND gate.

5. An N-bit programmable divider as defined in claim 2 wherein each of said multiple-input gates is a NOR gate.

* * * * *